US008480936B2

(12) United States Patent
Kim et al.

(10) Patent No.: US 8,480,936 B2
(45) Date of Patent: Jul. 9, 2013

(54) METHOD OF FABRICATING A MOLD

(75) Inventors: Jin Wuk Kim, Gyeonggi-do (KR); Yeon Heui Nam, Gangwon-do (KR)

(73) Assignee: LG Display Co., Ltd., Seoul (KR)

( * ) Notice: Subject to any disclaimer, the term of this patent is extended or adjusted under 35 U.S.C. 154(b) by 91 days.

(21) Appl. No.: 11/645,034

(22) Filed: Dec. 26, 2006

(65) Prior Publication Data

US 2008/0001332 A1 Jan. 3, 2008

(30) Foreign Application Priority Data

Jun. 30, 2006 (KR) ........................ 10-2006-0061020

(51) Int. Cl.
*B29C 35/08* (2006.01)

(52) U.S. Cl.
USPC ............ 264/225; 264/494; 264/496; 264/219

(58) Field of Classification Search
USPC ................. 264/494, 496, 219, 220, 225, 236, 264/299, 446, 227, 259, 340
See application file for complete search history.

(56) References Cited

U.S. PATENT DOCUMENTS 4,508,750 A * 4/1985 Foll et al. ........................ 427/498
4,847,137 A * 7/1989 Kellen et al. ................ 428/195.1
5,234,961 A * 8/1993 Tanis .............................. 521/51
5,956,112 A * 9/1999 Fujimori et al. .............. 349/156
6,113,836 A * 9/2000 Sakai et al. .................... 264/400
6,139,933 A * 10/2000 Van Wijk ..................... 428/64.1
6,242,504 B1 * 6/2001 Meyer-Roscher et al. ....... 522/2
6,320,709 B1 11/2001 Kitabayashi et al. ......... 359/831
6,335,775 B1 1/2002 Iwamura et al. .............. 349/125
6,778,753 B2 * 8/2004 Blomquist .................... 385/143
6,898,031 B1 * 5/2005 Belser et al. .................... 360/15
7,278,709 B2 10/2007 Park et al.
2002/0154266 A1 10/2002 Choo et al. .................... 349/187
2004/0021254 A1 * 2/2004 Sreenivasan et al. ......... 264/406
2004/0110856 A1 * 6/2004 Young et al. ....................... 522/6
2004/0131718 A1 * 7/2004 Chou et al. .................... 425/385
2005/0071953 A1 4/2005 Salice ............................. 16/285

(Continued)

FOREIGN PATENT DOCUMENTS

CN 1774672 5/2006
JP 1-92006 6/1989

(Continued)

OTHER PUBLICATIONS

Merriam-Webster Collegiate Dictionary Copyright 1997 by Merriam-Webster, Incorporated ISBN 0-87779-708-0 p. 328.*

(Continued)

*Primary Examiner* — Richard Crispino
*Assistant Examiner* — Martin Rogers
(74) *Attorney, Agent, or Firm* — Morgan, Lewis & Bockius LLP

(57) ABSTRACT

A method for fabricating a mold includes the steps of forming a photo-polymerizable resin layer between a master substrate and a transparent mold substrate, wherein a first pattern is formed on the master substrate; solidifying the resin layer by exposing the resin layer to a UV light through the transparent mold substrate; and forming a mold having a second pattern by separating the resin layer from the master substrate, wherein the second pattern is in a form of a recess on the resin layer at a portion corresponding to the first pattern and the resin layer being engaged with the mold substrate.

7 Claims, 2 Drawing Sheets

23
27
25
21

UV LIGHT
23
27
25
21

U.S. PATENT DOCUMENTS

| | | | | |
|---|---|---|---|---|
| 2005/0084613 | A1* | 4/2005 | Wang et al. | 427/282 |
| 2005/0164127 | A1* | 7/2005 | Reid et al. | 430/311 |
| 2005/0214661 | A1* | 9/2005 | Stasiak et al. | 430/22 |
| 2005/0255409 | A1 | 11/2005 | Park et al. | |
| 2006/0214326 | A1 | 9/2006 | Kim et al. | 264/225 |
| 2008/0063978 | A1 | 3/2008 | Park et al. | |

FOREIGN PATENT DOCUMENTS

| | | | |
|---|---|---|---|
| JP | 02-054447 | | 2/1990 |
| JP | 4-83611 | | 3/1992 |
| JP | 9-152612 | | 6/1997 |
| JP | 09-152612 | * | 6/1997 |
| JP | 11-2821 | | 1/1999 |
| JP | 11-223819 | | 8/1999 |
| JP | 2000-147362 | | 5/2000 |
| JP | 2001-356313 | | 12/2001 |
| JP | 2004-1498 | | 1/2004 |
| JP | 2004-68592 | | 3/2004 |
| JP | 2004-302388 | | 10/2004 |
| JP | 2004-309931 | | 11/2004 |
| JP | 2005-111975 | | 4/2005 |
| JP | 2006-26973 | | 2/2006 |
| KR | 20050108970 A | | 11/2005 |
| WO | WO 2004/090636 | * | 10/2004 |

OTHER PUBLICATIONS

Choi et al. An Ultraviolet-Curable Mold for Sub-100-nm Lithography Journal of the American Chemical Society, 2004 pp. 7744-7745.*

Wettability Control of a Polymer Surface Through 126 nm Vacuum Ultraviolet Light Irradiation Hozumi et al J. Vac. Sci. Technol. A 22, 1309 (2004); doi: 10.1116/1.1701867 pp. 1309-1314.*

Machine-generated English language translation of JP 09-152612 (original document dated Jun. 1997).*

Korean Office Action dated Aug. 14, 2012.

* cited by examiner

METHOD OF FABRICATING A MOLD

This application claims the benefit of Korean Patent Application No. 10-2006-0061020 filed in Korea on Jun. 30, 2006, which is hereby incorporated by reference.

BACKGROUND OF THE INVENTION

1. Field of the Invention

The present invention relates to a method for fabricating a mold that is used in fabricating a semiconductor integrated circuit and a flat panel display.

2. Discussion of the Related Art

A general integrated circuit and a flat panel display include a plurality of electrical circuits formed by a plurality of thin films made of a semiconductor material, an insulation material, a conductive material, and a filter material. Some of the plurality of thin films are patterned on a substrate. A patterning process using an etching mask (i.e., resist pattern) provides the patterned thin film. The resist pattern is formed by coating a resist material to an etched thin film, exposing the resist material, and developing the resist material.

The exposure process requires an exposure mask and exposure equipment to selectively expose the resist material. Thus, an additional handling step (i.e., arranging the exposure mask) is performed. Accordingly, the patterning process of the resist material including the exposure process has complex processing orders. Therefore, the yield rates of a semiconductor integrated circuit chip and the flat panel display can be compromised. In addition, since the prices of the exposure mask and the exposure equipment increases as desired the pattern requires more accuracy and the pattern area becomes larger. As a result, the patterning process, including the exposure process, increases the fabricating costs of the semiconductor integrated circuit chip and the flat panel display.

In order to solve the above problems, an IPP (In-Plane Printing) method without an exposure process is suggested. The IPP method forms a patterned thin film by transferring a desired pattern to a pattern object thin film. In addition, the IPP method can form a resist pattern by transferring the desired pattern to a resist material using a mold. The mold includes a resilient material where detailed patterns are depressed/stamped.

The mold is prepared by a related art fabricating method as shown in FIGS. 1A and 1B. Referring to FIG. 1A, a thermally cured resin 15 such as PDMS (polydimethylsiloxane) is formed on a master substrate 111 where a first pattern 13 is formed. The master substrate 11 is formed of silicon or glass and the first pattern 13 is formed of one of inorganic materials, such as silicon dioxide, silicon nitride, and metals and organic materials, such as a resist and a wax.

The resin layer 15 on the master substrate 11 is solidified by heat. Molecular chain of the PDMS in the resin layer 15 not solidified by the heat is released to a surface of the resin layer 15 contacting the master substrate 11. This is to maintain the surface energy of the resin layer 15 at a constant value. In other words, the resin layer 15 has only a constant surface characteristic (i.e., a lipophile property).

As shown in FIG. 1B, the thermally cured resin layer 15 is separated from the master substrate 11. The separated resin layer 15 has a recess 19 on the lower surface thereof, which is formed by the shape of the first pattern 13. Accordingly, the resin layer 15 having the recess 19 is used as a mold 17 to pattern a pattern object thin film or a resist material.

However, the IPP patterning method requires a mold having a different surface energy depending on the material of the pattern object thin film, the process condition, and the desired pattern. In order to satisfy the requirements of the IPP patterning method, an additional handling may be performed to reform the surface of the resin layer (i.e. the mold) using an SAMS (Self-assembled monolayers). This surface reforming work contributes to the more complex fabricating method of the mold. Further, since the related art mold fabricating resin layer is solidified thermally in a single process, the interior material not solidified by heat (i.e., solvent) is released outside the resin layer to deform the shape of the mold.

SUMMARY OF THE INVENTION

Accordingly, the present invention is directed to a method for fabricating a mold that substantially obviates one or more of the problems due to limitations and disadvantages of the related art.

An object of the present invention is to provide a method of fabricating a mold having a desired surface characteristic by changing the surface energy thereof.

Another object of the present invention is to provide a method for fabricating a mold that prevents deformation of the mold.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as claimed and broadly described, a method of fabricating a mold includes the steps of forming a photo-polymerizable resin layer between a master substrate and a transparent mold substrate, wherein a first pattern is formed on the master substrate; solidifying the resin layer by exposing the resin layer to a UV light through the transparent mold substrate; and forming a mold having a second pattern by separating the resin layer from the master substrate, wherein the second pattern is in a form of a recess on the resin layer at a portion corresponding to the first pattern and the resin layer being engaged with the mold substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF PREFERRED EMBODIMENTS

Reference will now be made in detail to the preferred embodiments of the present invention, examples of which are illustrated in the accompanying drawings.

Figure 1A:
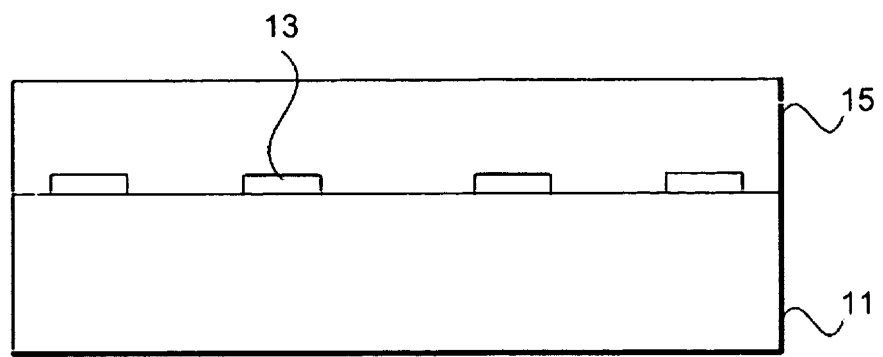
FIGS. 1A to 1B shows cross-sectional views of a related art method of fabricating a mold.
Figure 1B:
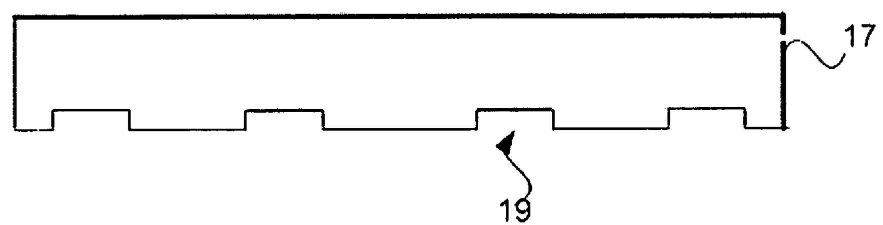
Figure 2A:
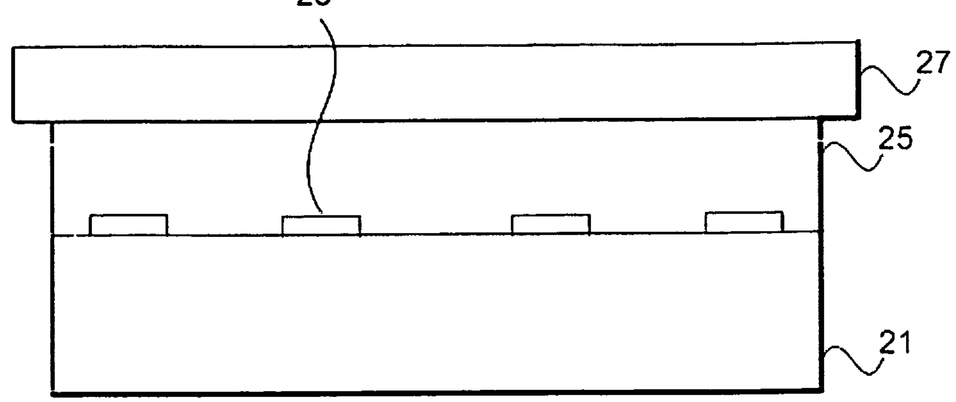
FIGS. 2A to 2C shows cross-sectional views of an exemplary method of fabricating a mold according to an exemplary embodiment of the present invention.
Figure 2B:
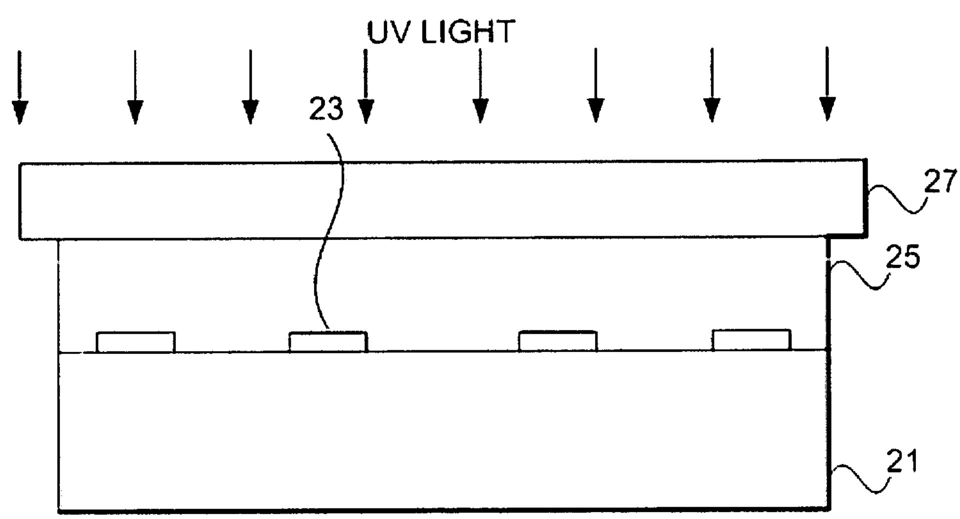
Figure 2C:
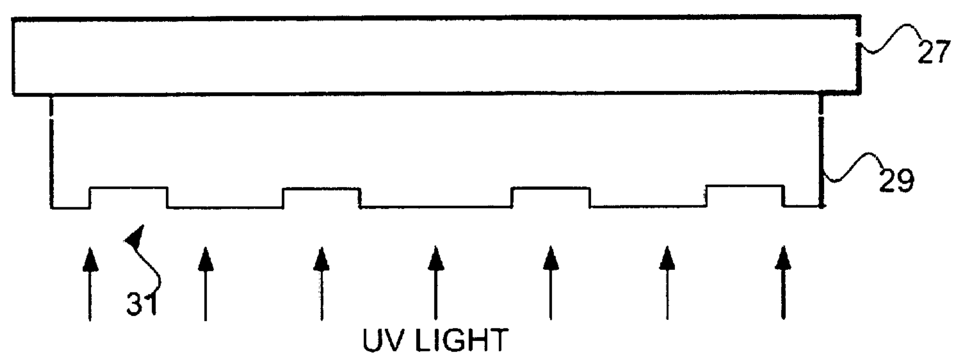

FIGS. 2A to 2C are cross-sectional views showing an exemplary method of fabricating a mold according to an exemplary embodiment of the present invention. As shown in FIG. 2A, a photo-polymerizable resin layer 25 is formed on a master substrate 21 on which a first pattern 23 is formed. A mold substrate 27 is formed on the resin layer 25. In the exemplary embodiment, the resin layer 25 is formed by coating a photo-polymerizable liquid resin on the master substrate 21 having the first pattern 23 thereon. Then, the mold substrate 27 is adhered to the resin layer 25. Alternatively, the resin layer 25 can be formed on the mold substrate 27 first. Thereafter, the master substrate 21 having the first pattern 23 can be adhered to the resin layer 25.

The master substrate 21 is formed of silicon or glass material and the first pattern 23 is formed of one of inorganic materials such as silicon dioxide, silicon nitride, and metals. The mold substrate 27 can be formed of a transparent material such as glass. The photo-polymerizable resin layer 25 includes a liquefied high molecular precursor material (i.e., one of polyurethane acrylate, glycidyl acrylate, and butyl mathacrylate). Further, a photo initiator such as irgacure 369 (2-Benzyl-2-(dimethylamino)-1-[4-(4-morpholinyl)phenyl]-1-butanone) or irgacure 819(phosphine oxide, phenyl bis(2,4,6-trimethyl benzoyl)) can be included in the liquefied high molecular precursor material. In another form, the photo-polymerizable resin layer 25 can include an organic solvent where the photo-polymerizable liquefied high molecular precursor material is diluted.

As shown in FIG. 2B, the resin layer 25 is exposed to UV (ultraviolet) light illuminated through the transparent mold substrate 27. The UV light is illuminated to the resin layer 25 at the strength of light of 3 to 20 mW/Cm$^2$ for 5 to 15 seconds. It is preferable that the UV ray is illuminated to the resin layer 25 for approximately 10 seconds. The illumination of the UV light allows the photo-polymerizable high molecular precursor in the resin layer 25 to be cross-linked or solidified by changing the arrangement of the high molecular precursor or the reaction portion. The strength of light of the UV light and the illumination period can be regulated to change the value of the surface energy of the resin layer 25. Further, the photo initiator included in the resin layer 25 promotes smooth reaction of the photo-polymerizable liquefied high molecular precursor material by the UV light.

As shown in FIG. 2C, the resin layer 25 solidified by the UV light is separated from the master substrate 21. The resin layer 25 is still adhered to the mold substrate 27. A second pattern in the form of a recess 31 is provided on a surface of the separated resin layer 25. The separated resin layer 25 can be exposed to the UV light through the mold substrate 27 and be solidified a second time. Through the second solidifying process, the interior of the resin layer 25 is solidified as well as the surface thereof.

In the second hardening process, the UV light is illuminated to the resin layer 25 at the strength of 3 to 20 mW/cm$^2$ for 20 seconds to 30 minutes. It is preferable that the illumination of the UV light is performed at the strength of approximately 3 or 11 mW/cm$^2$ for approximately 1 or 10 minutes. The second UV light allows the surface energy of the resin layer 25 to have various values by changing the cross-linking degree in the interior of the resin layer 25, the reacting portion, or the molecular arrangement. In addition, the photo initiator included in the resin layer 25 promotes smooth reaction of the photo-polymerizable liquefied high molecular precursor material by the UV light.

The resin layer 25 solidified by the UV light is used as a mold 29 in an IPP pattern method. Since the resin layer 25 is solidified by UV light twice, the interior and the exterior surface of the resin layer 25 is completely solidified and the shape of the recess 31 (or reaction portion) is maintained. Thus, the deformation of the mold 29 is prevented. The resin layer 25 adhered to the mold substrate 27 allows a thin film pattern to be formed without an exposure process. Similarly, a resist pattern is formed without the exposure process. The thin film pattern is used to fabricate a circuit device and the resist pattern is used as an etching mask.

The surface energy of the mold 29 changes according to the first and second illumination conditions. Therefore, the mold 29 can selectively include a lipophile or hydrophile surface characteristic. Actually, when the surface energy of the mold 29 is large, the mold 29 has a hydrophile surface characteristic. On the other hand, when the surface energy thereof is small, it has a lipophile surface characteristic. After the mold 29 is formed, additional UV light is no longer required.

The following Table 1 represents the surface energy of the mold 29 obtained experimentally.

TABLE 1

| Solidifying condition | | | | Experimental result | | | |
|---|---|---|---|---|---|---|---|
| First illumination condition | | Second illumination condition | | Surface energy | | | |
| Strength of light (mW/cm$^2$) | Period (sec) | Strength of light (mW/cm$^2$) | Period (sec) | Total sum (T) | Distribution (D) | Polarity (P) | D/P |
| 3 | 10 | None | | 50.3 | 41.0 | 9.3 | 4.4 |
| 3 | 10 | 3 | 60 | 38.3 | 31.4 | 6.9 | 4.5 |
| 3 | 10 | 3 | 300 | 32.6 | 26.4 | 6.2 | 4.3 |
| 3 | 10 | 11 | 60 | 32.7 | 26.6 | 6.1 | 4.3 |
| 3 | 10 | 11 | 300 | 28.1 | 23.1 | 5.0 | 4.6 |
| 11 | 10 | None | | 47.6 | 39.4 | 8.2 | 4.8 |
| 11 | 10 | 3 | 60 | 34.6 | 29.4 | 5.3 | 5.6 |
| 11 | 10 | 3 | 300 | 26.5 | 23.7 | 2.8 | 8.5 |
| 11 | 10 | 11 | 60 | 30.4 | 26.5 | 3.8 | 6.9 |
| 11 | 10 | 11 | 300 | 23.5 | 20.8 | 2.6 | 7.9 |

In the experiments, distinct UV light strengths and illuminating periods were applied to the resin layer 25. One of the first illumination conditions were UV light strength of approximately 3 mW/cm$^2$ and an illuminating period of about 10 seconds. Another one of the first illumination conditions were UV light strength of about 11 mW/cm$^2$ and an illuminating period of about 10 seconds. Then, one of the second illumination conditions were 3 mW/$cm^2$ for about 1 min or 5 min, and another one of 11 mW/$cm^2$ for about 1 or 5 minutes.

In a first case, only a first illumination of 3 mW/$cm^2$ for 10 seconds was performed (i.e., no second illumination), the results included distribution D=41.0, polarity P=9.3, total sum T=50.3, and D/P ratio=4.4. In a second case, first illumination of 3 mW/$cm^2$ for 10 seconds and second illumination of 3 mW/$cm^2$ for 60 seconds were performed, the results included the distribution D=31.4, the polarity P=6.9, the total sum T thereof=38.3, and the D/P ratio=4.5. In a third case, first illumination of 3 mW/$cm^2$ for 10 seconds and second illumination of 3 mW/$cm^2$ for 300 seconds were performed, the results included the distribution D=26.4, the polarity P=6.2, the total sum T thereof=32.6, and the D/P ratio=4.3. In a fourth case, first illumination of 3 mW/$cm^2$ for 10 seconds and the second illumination of 11 mW/$cm^2$ for 60 seconds were performed, the results included distribution D=26.6, the polarity P=6.1, the total sum T=32.7, and the D/P ratio=4.3. In a fifth case, first illumination 3 mW/$cm^2$ for 10 seconds and the second illumination of 11 mW/$cm^2$ for 300 seconds, the results included the distribution D=23.1, the polarity P=5.0, the total sum T=28.1, and the D/P ratio=4.6.

From Table 1, the surface energy of the mold 29 was largest when no second illumination was performed. Then, given the same first illumination condition, the surface energy became lower as the strength of UV light and/or the illuminating period were increased in the second illumination. Further, given the same first illumination condition and the same illuminating period in the second illumination, the surface energy of the mold 29 became lower as the strength of the UV light was increased. As shown in Table 1, the distribution D, the polarity P, the total sum T, and the D/P ratio of the surface energy of the mold 29 are all decreased as compared to the result of first illumination at the strength of 3 mW/$cm^2$. For example, when only the first illumination of 11 mW/$cm^2$ for 10 seconds was performed, the results included distribution D=39.4, polarity P=8.2, total sum T=47.6, and the D/P ratio=4.8. In other words, when a first illumination of 11 mW/$cm^2$ for 10 seconds and a second illumination of 3 mW/$cm^2$ or 11 mW/$cm^2$ for 1 to 5 minutes were performed, values of the distribution D, the polarity P, the total sum T, and the D/P ratio were all lower than those in the case when the first illumination of 3 mW/$cm^2$ for 10 seconds and the second illumination of 3 mW/$cm^2$ or 11 mW/$cm^2$ for 1 to 5 minutes were performed.

As mentioned above, the surface energy of the mold 29 according to the first and second illumination conditions can have various values ranging from 23 to 50. Generally, if the surface energy of the mold 29 is large, the mold 29 has a hydrophile surface characteristic. On the contrary, if the surface energy is small, the mold 29 has a lipophile surface characteristic. Therefore, the mold 29 includes the hydrophile property if the strength of second UV light is small and the second illuminating period is short given the same first illumination condition. On the other hand, the mold 29 includes the lipophile property when the strength of second UV light is large and the second illuminating period is long. In addition, the mold 29 has a hydrophile property if the strength of UV light in the first illumination is small and has a lipophile property if it is large given the same second illumination condition.

As mentioned above, the resin layer is formed by coating a resin having a photo-polymerizable characteristic on the master substrate having the first pattern formed thereon. The resin layer is adhered to a transparent mold substrate, then, the surface of the resin layer is solidified by illuminating the first UV light. The mold is formed by separating the solidified resin layer from the master substrate with the resin layer being adhered to the mold substrate.

In the exemplary embodiment of the present invention, a UV light can be additionally illuminated on the firstly illuminated resin layer. The interior of the resin layer is solidified by illuminating the resin layer with UV light twice. Accordingly, deformation of the shape of the mold can be prevented. Further, since the surface energy of the mold can be regulated by the first and second illumination conditions, the surface characteristic of the mold can be easily selected.

It will be apparent to those skilled in the art that various modifications and variations can be made in the method of fabricating the mold of the present invention without departing from the spirit or scope of the invention. Thus, it is intended that the present invention covers the modifications and variations of this invention provided they come within the scope of the appended claims and their equivalents.

What is claimed is:

1. A method for fabricating molds, the method comprising:

a) forming a photo-polymerizable resin layer between a master substrate, including a first pattern thereon, and a transparent mold substrate wherein the first pattern is formed of a different material from that of the master substrate, wherein the first pattern includes a material selected from the group of silicon dioxide, silicon nitride, and metal, wherein the master substrate and mold substrate are formed of a glass material;

b) performing a first solidifying operating in which the resin layer is solidified by exposing the resin layer to UV light of 3-20 mW/$cm^2$ for 5-15 seconds through the transparent mold substrate;

c) forming a second pattern, on the resin layer, by separating the solidified resin layer from the master substrate, the resin layer remaining attached to the mold substrate after separation and possessing the second pattern at a surface opposite the mold substrate, the second pattern being a negative impression of the first pattern such that the second pattern comprises a plurality of recesses created by protrusions of the first pattern;

d) performing a second solidifying operation in which the outermost layer of resin is further solidified by directly exposing the previously solidified resin layer to a second UV light having a first intensity and first illumination period, thereby obtaining mold with a hydrophilic surface; and e) forming a second mold by repeating steps a, b, and c as they were performed for the first mold, including using the same type of photo-polymerizable resin material, followed by performing a third solidifying operation in which the outermost layer of the resin of the second mold is further solidified by directly exposing the previously solidified resin layer of the second mold to a third UV light having a second intensity, longer than the first intensity, and a second illumination period, longer than the first illumination period, thereby obtaining the second mold, the second mold having a lipophilic surface.

2. The method according to claim 1, wherein the forming of the resin layer further comprises:

coating a resin on the master substrate; and adhering the master substrate having the resin coated thereon to the mold substrate.

3. The method according to claim 1, wherein the forming the resin layer further comprises:

coating a resin on the mold substrate; and adhering the mold substrate having the resin coated thereon to the master substrate.

4. The method for fabricating a mold according to claim 1, wherein the resin layer includes one of polyurethane acrylate, glycidyl acrylate, and butyl methacrylate.

5. The method for fabricating a mold according to claim 1, wherein the resin layer includes a photo initiator.

6. The method for fabricating a mold according to claim 5 wherein the photo initiator includes one of 2-Benzyl-2-(dimethylamino)-1-[4-(4-morpholinyl)phenyl]-1-butanone and phosphine oxide and phenyl bis(2,4,6-trimethyl benzoyl).

7. The method for fabricating a mold according to claim 1, wherein the second UV light is illuminated on the outermost layer at a strength of approximately 3 or 11 mW/cm$^2$ for approximately 1 or 10 minutes.

* * * * *